United States Patent [19]

Haman

[11] Patent Number: 5,341,112
[45] Date of Patent: Aug. 23, 1994

[54] TEMPERATURE STABLE OSCILLATOR CIRCUIT APPARATUS

[75] Inventor: Leo J. Haman, Cedar Rapids, Iowa

[73] Assignee: Rockwell International Corporation, Seal Beach, Calif.

[21] Appl. No.: 74,255

[22] Filed: Jun. 9, 1993

[51] Int. Cl.$^5$ .................. H03B 5/12; H03B 5/36; H03L 1/02
[52] U.S. Cl. .................. 331/116 R; 331/117 R; 331/158; 331/176
[58] Field of Search ........ 331/116 R, 116 FE, 117 R, 331/117 FE, 117 D, 108 C, 158, 176, 185

[56] References Cited

U.S. PATENT DOCUMENTS

| | | | |
|---|---|---|---|
| 3,831,111 | 8/1974 | Lafferty | 331/176 X |
| 4,048,590 | 9/1977 | Dobberpuhl | 331/116 R |
| 4,096,452 | 6/1978 | Waku et al. | 331/176 X |
| 4,152,675 | 5/1979 | Jett, Jr. | 331/116 R |
| 4,581,593 | 4/1986 | Okanobu | 331/176 X |
| 4,591,807 | 5/1986 | Davis | 331/116 R |
| 4,853,654 | 8/1989 | Sakurai | 331/176 X |
| 5,140,286 | 8/1992 | Black et al. | 331/99 |

*Primary Examiner*—David Mis
*Attorney, Agent, or Firm*—Kyle Eppele; M. Lee Murrah; H. Fredrick Hamann

[57] ABSTRACT

A stabilized oscillation circuit includes a bias circuit which controllably biases a bipolar-transistor-driven crystal oscillator circuit. The bipolar-transistor-driven crystal oscillator circuit is a modified version of a conventional transistor-driven oscillator, such as a Hartley, Pierce or Colpitts-type circuit. The bias circuit includes a first current providing a reference current through a Schottky diode and a pair of bipolar transistors. The bipolar-transistor-driven crystal oscillator circuit includes an input and an output, where the input of the bipolar-transistor-driven crystal oscillator circuit is coupled to the bias circuit. The bipolar-transistor-driven crystal oscillator circuit includes a second current through a second bipolar transistor. The second current tracks the reference current so that the output of the bipolar-transistor-driven oscillator circuit is substantially constant over variations in ambient temperature.

12 Claims, 1 Drawing Sheet

TEMPERATURE STABLE OSCILLATOR CIRCUIT APPARATUS

FIELD OF THE INVENTION

The present invention relates generally to circuits providing a stable oscillating signal and, more particularly, to stabilizing circuits for oscillators having an output which tends to fluctuate due to temperature changes.

BACKGROUND OF THE INVENTION

Providing a high-stability reference frequency is an important part of many communication and navigation systems operating in environments subject to substantial variations in temperature. Typically, the reference frequency is provided using a transistor-driven oscillator circuit having a crystal oscillator or an inductance-capacitance (L-C) network to establish a selected operating frequency. For example, feedback oscillator circuits, such as the Colpitts, Pierce or Hartley types, operate by returning a portion of the output signal to the input to sustain oscillation by positive feedback. Achieving a reference frequency that is highly stable in such a transistor-driven oscillator circuit typically requires use of a temperature-controlled quartz-crystal oscillator, such as those manufactured and sold by the instant assignee, Rockwell International Corporation.

Many applications require that the high-stability reference frequency be provided using circuitry reduced in both size and power consumption. Typically, small size implies integrating as much of the circuitry as possible into an integrated circuit, and low power suggests using low supply voltages. Unfortunately, implementation in an integrated circuit using low circuit supply voltages degrades the performance of most oscillators used for high-stability applications, and as requirements for low power consumption and small size become more stringent, the degradation becomes more severe.

More specifically, when a transistor-driven oscillator circuit is powered using a low supply voltage, the base-emitter junction voltage (Vbe) of the oscillator transistor represents a significant portion of the available circuit voltage. This Vbe changes over the military temperature operating range specified by many military standards by almost fifty percent. In low-voltage applications requiring a highly stable reference frequency, such a Vbe change is unacceptable because it significantly changes the operating point of the circuit and negates the desired stability.

When a transistor-driven oscillator circuit is implemented in an integrated circuit, space is a primary concern. While transistors can be implemented in a relatively small silicon area or nano-acre, the area required for a resistor is relatively large and the demand for silicon increases with the value of the resistor. Therefore, it is desirable to implement such circuit designs in integrated circuits using as few resistors as possible and with small resistance values. Previously implemented high-stability crystal oscillator circuits, however, typically require a lot of resistance, using many resistors and/or using resistors having large resistance values. Usage of "real-estate" within the integrated circuit for such a resistance requirement eliminates silicon needed for other circuitry and can require significant compromises with respect to the stability of the reference frequency.

Accordingly, there is a need for a high-stability oscillator circuit which can be implemented using few resistors, small resistances and low supply voltages.

SUMMARY OF THE INVENTION

The present invention provides a high-stability oscillator circuit which can be implemented in integrated circuit form using a relatively small amount of silicon area in the integrated circuit device and using low supply voltages. In a preferred high-stability oscillator circuit described below and in accordance with the present invention, only a few resistors are used and each resistor has a relatively small resistance value.

A stabilized oscillation circuit includes a bias circuit having a reference current, and a bipolar-transistor-driven oscillator circuit having an input and an output. The bipolar-transistor-driven oscillator circuit includes a second current which tracks the reference current so that the output of the bipolar-transistor-driven oscillator circuit is substantially constant.

The above summary is not intended to describe each aspect of the present invention, as this is the purpose of the discussion below.

BRIEF DESCRIPTION OF THE DRAWINGS

Other objects and advantages of the invention will become apparent upon reading the following detailed description and upon reference to the drawings in which.

Figure 1:
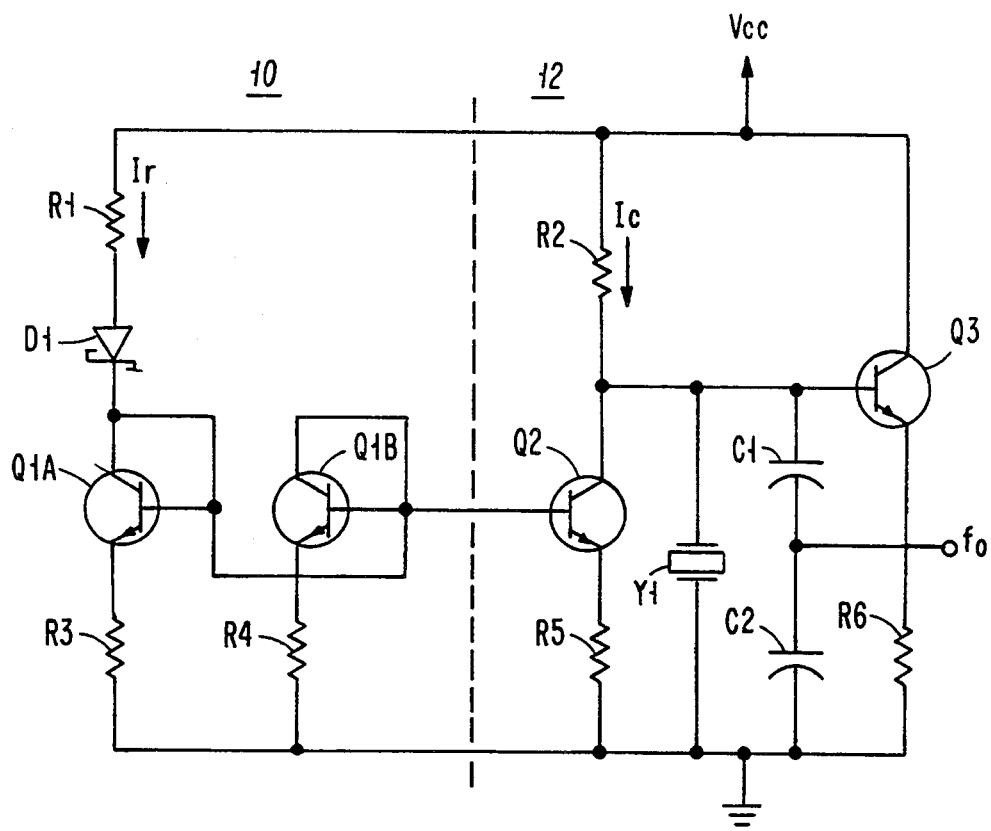
FIG. 1 is a schematic diagram of an oscillation circuit having a stabilized output frequency, according to the present invention.

While the invention is susceptible to various modifications and alternative forms, specific embodiments thereof have been shown by way of example in the drawings and will be described in detail. It should be understood, however, that it is not intended to limit the invention to the particular form described. On the contrary, the intention is to cover all modifications, equivalents and alternatives falling within the spirit and scope of the invention as defined by the appended claims.

DETAILED DESCRIPTION OF THE SPECIFIC EMBODIMENTS

Turning now to the drawings and particularly to FIG. 1, the present invention is shown being implemented as a bias circuit 10 coupled to a slightly modified transistor-driven Colpitts-type oscillator circuit 12. A conventional Colpitts oscillator includes, as shown in FIG. 1, resistors R2, R5 and R6, a transistor Q3, a crystal oscillator Y1, and a pair of capacitors C1 and C2, with the exception that the resistors R2 and R5 be contiguously connected in series without the presence of transistor Q2. In accordance with the present invention, the circuit arrangement of FIG. 1 improves the performance of the conventional Colpitts oscillator significantly by using the bias circuit 10 to provide a reference current $I_r$ which, in combination with a control current $I_c$, act as a current mirror. This results in an oscillator circuit having a highly-stable reference frequency $f_o$.

Figure 2:
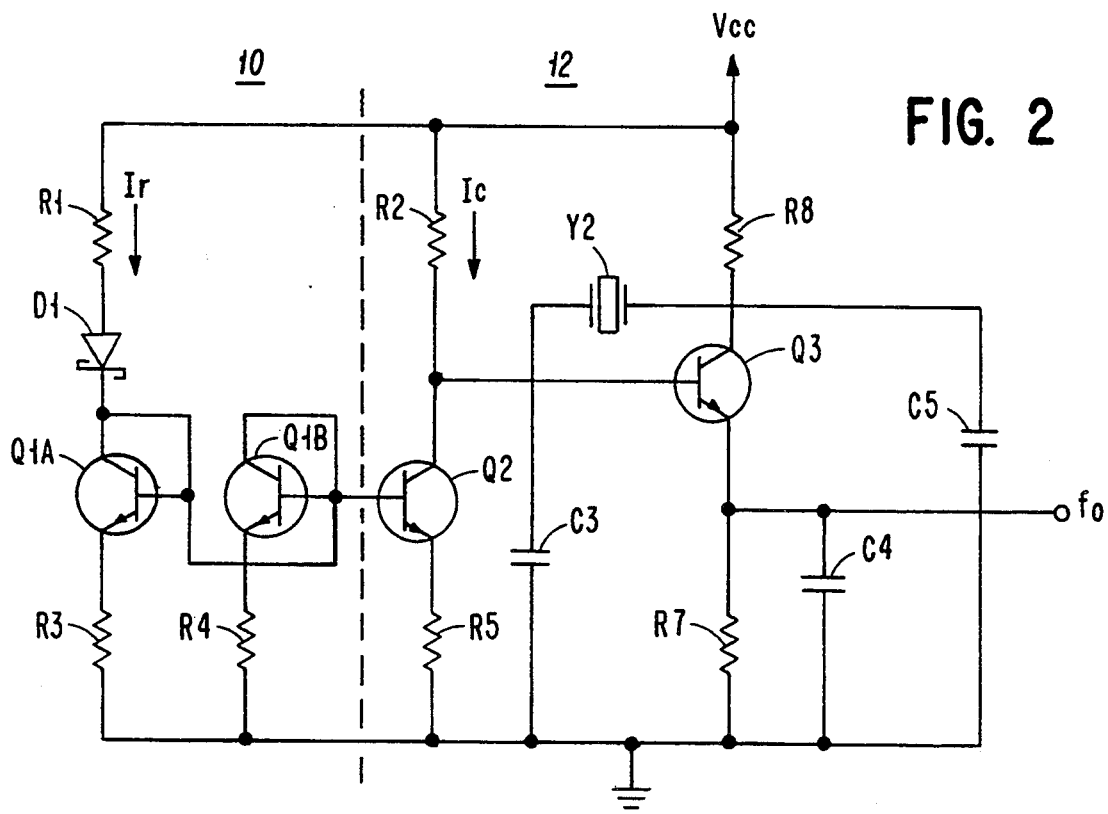
FIG. 2 is a schematic diagram of an alternative oscillation circuit having a stabilized output frequency, also in accordance with the present invention.

Accordingly, an important aspect of the present invention is that it can be implemented with well-known and conventionally-used transistor-driven oscillator circuits, such as a Colpitts or Pierce-type oscillator circuit. FIG. 1 illustrates an exemplary implementation of the present invention incorporating a modified Colpitts-type oscillator circuit, and FIG. 2 illustrates an exemplary implementation of the present invention incorporating a modified Pierce-type oscillator circuit. Other types of conventional oscillator circuits, for example, the Hartley-type oscillator circuit, can be similarly modified in accordance with the present invention. While use of one of these particular types of conventional oscillator circuits is not essential to the present invention, such use is considered highly advantageous because it minimizes the effort needed to utilize the present invention with existing circuits.

The circuit of FIG. 1 will now be explained in detail. The current mirror established by the currents $I_r$ and $I_c$ provides temperature compensation for the base-emitter junction of the transistor driving the oscillator which, in FIG. 1, is the bipolar NPN transistor Q3. The compensation forces the voltage level at the emitter of transistor Q3, with respect to neutral, to remain constant over temperature. To achieve this result, the current through R2 is increased, which lowers the level of the bias voltage at the base of the transistor Q3, as the level of the base-emitter junction voltage of the transistor Q3 drops. This allows the oscillator circuit's operating point, and reference frequency $f_o$, to remain constant.

The current mirror provided by currents $I_r$ and $I_c$ presents a very high resistance to the rest of the oscillator circuit 12, as would be expected from a current source. Thus, acting as a current source, the current mirror simultaneously satisfies the high resistance requirement of a highly stable crystal oscillator and, at the same time, requires a minimal amount of resistance. Because this design requires very little space, the circuit of FIG. 1 is ideal for implementation in an integrated circuit.

If the circuit in FIG. 1 were to be replaced by the above-described conventional Colpitts design (directly connecting resistors R2 and R5) and if Vcc is assumed to be a 3.0 volt supply, the voltage across R6 would change over temperature from 0.60 V at −55° C. to 0.90 at +125° C. This is a fifty percent change in emitter current through the transistor Q3, causing a significant change in the circuit's operating point and thus degrading the performance of the Colpitts circuit.

Using the modified current mirror in the bias circuit 10 of the Colpitts oscillator, the present invention compensates for the temperature-induced change in the base-emitter junction voltage of the transistor Q3, so that the voltage change at the emitter of the transistor Q3 and across R6 is minimized, resulting in a constant current through the transistor Q3. The magnitude of current in the reference current $I_r$ is determined by the voltage across the resistor R1 divided by its resistance. The voltage across R1 is Vcc minus the sum of the Vbe voltage drop of the transistor Q1A, the anode-cathode drop of the Schottky diode D1 and the minimal drop across the resistor R3. Because these base-emitter and anode-cathode voltages will change over temperature, the voltage across the resistor R1 and the current flowing through the resistor R1 will change accordingly. Further, since the bases of the transistors Q1A, Q1B, and Q2 are all connected together and since all the transistors have matched doping characteristics, selecting the values of R3, R4, and R5 to have equal resistance values causes the collector current through each of these transistors to be the same. Therefore, the current change in the resistor R1 will be reflected as, or will follow with, a current change in the resistor R2.

At cold temperatures the current flowing through the resistor R1 will be reduced due to the increase in the Vbe of the transistor Q1A. A reduced current level through the resistor R1 will be reflected by the current mirror as a reduced level of current through the resistor R2, which will raise the base voltage of the transistor Q3. Since the Vbe of the transistor Q3 is also greater at cold temperatures, the net effect will be to leave the transistor Q3 emitter at the same voltage.

At high temperatures the current flowing through the resistor R1 will be increased due to the decrease in Vbe of the transistor Q1A. An increased level of current through the resistor R1 will be reflected by the current mirror as an increased level of current through the resistor R2, and this will lower the base voltage at the transistor Q3. Since the Vbe of the transistor Q3 is also lower at higher temperatures, the net effect will be to leave the emitter of the transistor Q3 at the same voltage.

In an exemplary implementation of the present invention, which has been tested and proven to improve the emitter voltage stability of the transistor Q3 of FIG. 1 by approximately 22 dB, the following component values are suggested (with Vcc at 3.1 volts):

| | |
|---|---|
| R1 = 8 kilohms | R3 = R4 = R5 = 3 kilohms |
| R2 = 12 kilohms | R6 = 3.3 kilohms |
| C1 = C2 = 68 picoFarads | |

FIG. 2 shows another exemplary implementation of the present invention using a modification to a conventional Pierce-type oscillator design. A conventional Pierce-type oscillator includes, as arranged and connected as shown in FIG. 2, resistors R2, R5, R7 and R8, a transistor Q3, a crystal oscillator Y2 and capacitors C3, C4 and C5, with the exception that the resistors R2 and R5 be contiguously connected in series without the presence of transistor Q2.

The operation of the inventive circuit of FIG. 2 is essentially the same as the operation described above for the circuit of FIG. 1. Common component designation notation in FIGS. 1 and 2 has been used to show the similarity of the operation of the respective circuits in each of the Figures.

In a manner similar to the circuit of FIG. 1, the circuit of FIG. 2 uses the currents $I_r$ and $I_c$ to provide temperature compensation for the base-emitter junction of the transistor Q3. Thus, as the level of the base-emitter junction voltage of the transistor Q3 changes, the voltage level at the emitter of the transistor Q3 remains constant over temperature by changing the current through R2 and raising the level of the bias voltage at the base of the transistor Q3 in the opposite direction. This allows the operating point of the oscillator circuit to remain constant, and maintains a highly-stable reference frequency $f_o$.

Accordingly, the present invention provides a stable oscillator circuit using few resistors, small resistor values and low supply voltages, making the invention ideal for implementation in an integrated circuit.

Those skilled in the art will readily recognize that various modifications and changes may be made to the present invention without departing from the true spirit and scope thereof. For example, conventional or non-conventional type oscillation circuits may be modified in a manner similar to that which has been described in connection with FIGS. 1 and 2. Further, a crystal oscillator is preferred but not required. Alternative oscillator arrangements, such as an L-C network, can be used instead. Each of these variations, and others, would not escape the true spirit of the present invention, which is set forth in the following claims.

I claim:

1. A temperature stable oscillation circuit, comprising:
   a bias circuit having a first current output;
   a mirror circuit means having a second current output;
   a bipolar-transistor having it's base-emitter junction coupled to the bias circuit current output and the mirror circuit means output; and
   a crystal oscillator coupled to and serially disposed between the bipolar-transistor base and emitter terminal such that a driver current from the bipolar transistor to the crystal oscillator is temperature compensated by the mirror circuit means current output.

2. A stabilized oscillation circuit, according to claim 1, wherein said bias circuit means reference current biases a pair of bipolar transistors.

3. A stabilized oscillation circuit, according to claim 2, wherein said bias circuit means includes a first resistor and said mirror circuit means includes a second resistor, said first and second resistors having equal resistances.

4. A stabilized oscillation circuit, according to claim 3, wherein said bias circuit means further includes a Schottky diode establishing a voltage drop in the first current path.

5. A stabilized oscillation circuit, according to claim 1, wherein said circuit is arranged as a Pierce oscillator.

6. A stabilized oscillation circuit, according to claim 1, wherein said circuit is arranged as a Colpitts oscillator.

7. A stabilized oscillation circuit, comprising:
   a bias circuit having a current path providing a reference current through a first pair of bipolar transistors; and
   a bipolar-transistor-driven crystal oscillator circuit comprised of a second pair of bipolar transistors, the bipolar-transistor-driven crystal oscillator circuit being coupled to the bias circuit and including a control current through a bipolar transistor, the control current tracking the reference current so that the output of the bipolar-transistor-driven oscillator circuit is substantially constant.

8. A stabilized oscillation circuit, according to claim 7, wherein said bipolar-transistor-driven oscillator circuit includes a crystal oscillator and an NPN transistor having a collector coupled to the crystal oscillator.

9. A stabilized oscillation circuit, according to claim 7, further including a first resistor in the control current and second and third resistors respectively coupled to the first pair of bipolar transistors.

10. A stabilized oscillation circuit, according to claim 9, wherein the second and third resistors have equal resistances.

11. A stabilized oscillation circuit, according to claim 10, wherein the first resistor has a resistance equal to the resistance of the second and third resistors.

12. A stabilized oscillation circuit, according to claim 7, wherein the bias circuit includes a Schottky diode.

* * * * *